US012663450B2

(12) United States Patent
Lu et al.

(10) Patent No.: US 12,663,450 B2
(45) Date of Patent: Jun. 23, 2026

(54) NON-INTRUSIVE LOAD MONITORING METHOD BASED ON V—I TRAJECTORY AND NEURAL NETWORK

(71) Applicant: ZHEJIANG UNIVERSITY, Hangzhou (CN)

(72) Inventors: Lingxia Lu, Hangzhou (CN); Jusong Kang, Hangzhou (CN); Miao Yu, Hangzhou (CN); Bingnan Wang, Hangzhou (CN); Zhejing Bao, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 114 days.

(21) Appl. No.: 18/322,571

(22) Filed: May 23, 2023

(65) Prior Publication Data

US 2023/0296654 A1     Sep. 21, 2023

Related U.S. Application Data

(63) Continuation of application No. PCT/CN2021/134659, filed on Nov. 30, 2021.

(30) Foreign Application Priority Data

Dec. 8, 2020    (CN) .......................... 202011443609.8

(51) Int. Cl.
| | |
|---|---|
| *G01R 21/00* | (2006.01) |
| *G01R 22/10* | (2006.01) |
| *G06N 3/0464* | (2023.01) |

(52) U.S. Cl.
CPC ........... *G01R 21/003* (2013.01); *G01R 22/10* (2013.01); *G06N 3/0464* (2023.01)

(58) Field of Classification Search
CPC .... G01R 21/003; G01R 22/10; G01R 21/133; G06N 3/0464; G06N 3/09; G06N 3/045;
(Continued)

(56) References Cited

U.S. PATENT DOCUMENTS

| | | | |
|---|---|---|---|
| 2013/0123882 A1 | 5/2013 | Towe | |
| 2018/0096439 A1* | 4/2018 | Davies | ................... G06Q 30/04 |

(Continued)

FOREIGN PATENT DOCUMENTS

| | | | | |
|---|---|---|---|---|
| CN | 109946543 A | * | 6/2019 | |
| CN | 110188771 A | * | 8/2019 | ........... G06K 9/4671 |

(Continued)

OTHER PUBLICATIONS

Y. Liu, X. Wang and W. You, "Non-Intrusive Load Monitoring by Voltage-Current Trajectory Enabled Transfer Learning," in IEEE Transactions on Smart Grid, vol. 10, No. 5, pp. 5609-5619, Sep. 2019 (Year: 2019).*

(Continued)

*Primary Examiner* — Daniel R Miller
(74) *Attorney, Agent, or Firm* — Wiersch Law Group

(57) ABSTRACT

A non-intrusive load monitoring method based on V-I trajectory and neural network includes: collecting the household voltage, current and active power data in real time; determining whether there is a switching event and whether the load operating state has reached a steady state through the change of the active power; obtaining the voltage, current and power data of the load, converting the V-I trajectory into RGB color image containing the phase difference between the voltage and current, power and other information. After obtaining the RGB color image, performing normalization processing and performing load monitoring through pre-trained convolutional neural network. The present disclosure fully extracts the steady-state feature of
(Continued)

the load through the convolutional neural network, and the neural network model can directly run on an embedded device, and does not need to rely on the computing support of a server.

1 Claim, 4 Drawing Sheets

(58) Field of Classification Search
CPC ............................... G06N 3/08; Y04S 20/242; G06Q 10/063114; G06Q 50/06
See application file for complete search history.

(56) References Cited

U.S. PATENT DOCUMENTS

| | | | |
|---|---|---|---|
| 2020/0184278 A1 | 6/2020 | Zadeh et al. | |
| 2020/0225060 A1* | 7/2020 | Davies ..................... | G01D 4/00 |

FOREIGN PATENT DOCUMENTS

| | | | |
|---|---|---|---|
| CN | 111103477 A | * | 5/2020 |
| CN | 111766462 A | | 10/2020 |
| CN | 111864896 A | | 10/2020 |
| CN | 112180193 A | | 1/2021 |
| CN | 112418722 A | | 2/2021 |

OTHER PUBLICATIONS

A. P. Medeiros, L. N. Canha, D. P. Bertineti and R. M. de Azevedo, "Event Classification in Non-Intrusive Load Monitoring Using Convolutional Neural Network," 2019 IEEE PES Innovative Smart Grid Technologies Conference—Latin America (ISGT Latin America), Gramado, Brazil, 2019, pp. 1-6 (Year: 2019).*
International Search Report (PCT/CN2021/134659); Date of Mailing: Mar. 1, 2022.
First Office Action(CN202011443609.8); Date of Mailing: Jun. 30, 2021.

* cited by examiner

NON-INTRUSIVE LOAD MONITORING METHOD BASED ON V—I TRAJECTORY AND NEURAL NETWORK

CROSS-REFERENCE TO RELATED APPLICATIONS

The present application is a continuation of International Application No. PCT/CN2021/134659, filed on Nov. 30, 2021, which claims priority to Chinese Application No. 202011443609.8, filed on Dec. 8, 2020, the contents of both of which are incorporated herein by reference in their entireties.

TECHNICAL FIELD

The present disclosure relates to the technical field of non-intrusive load monitoring (NILM) and in particular, to a non-intrusive load monitoring method based on V-I trajectory and neural network.

BACKGROUND

Load monitoring methods mainly include two categories: intrusive load monitoring and non-intrusive load monitoring. The intrusive load monitoring method has a more accurate monitoring result, but is not popular due to the high cost. The non-intrusive load monitoring method (NILM) has low cost and strong practicability, so NILM has become the current hot spot in the field of power system intelligent metering. By installing an embedded non-intrusive monitoring module on the household electricity meter, and then the load working condition in the building is detected through a load monitoring algorithm. Combined with effective power management, power saving and energy saving can be achieved without affecting the user experience.

Studies shows that the consumers can be motivated to save energy if they are provided with the actual energy consumption about the building. According to statistics, 10%-20% of energy can be effectively saved. Therefore, the non-intrusive load monitoring device has a wide application prospect.

Most NILM methods at present fail to sufficiently utilize the steady-state features of the electrical load. In general, cloud servers are used as data processing centers, and many monitoring operations depend on the servers. For some load monitoring methods, the V-I trajectory features of the load in steady state are used for load monitoring, and the power features of the load are not fully utilized. For other methods, only some current harmonic components in steady state and the power features of the load are used, and the V-I trajectory features are not fully utilized.

SUMMARY

In view of the deficiencies of the prior art, the present disclosure proposes a load monitoring method that can fully utilize both the V-I trajectory features and the power features. The technical solution adopted is as follows:

A non-intrusive load monitoring method based on V-I trajectory and neural network includes the following steps:

Step 1, collecting voltage, current and power data of an electric household side in real time, and performing filtering.

Step 2, determining whether a switching event occurs through the bilateral sliding window algorithm, if no switching event occurs, returning to step 1.

Step 3, if it is detected that a switching event is occurs, after the load reaches a steady state, obtaining voltage, current and power data of the load at the steady state according to the steady-state data before and after the event.

Step 4, obtaining a V-I trajectory through the steady-state voltage and current data obtained in step 3, and then converting the V-I trajectory into an RGB image with a size of 2N*2N, where the power is expressed as the pixel value of the RGB image.

Step 5, normalizing the RGB image obtained in step 4, and using a monitoring network to obtain a load monitoring result, where the monitoring network comprises a convolutional neural network which uses historical operation data of the electrical equipment and an RGB color image based on features of the V-I trajectory constructed by the historical operation data as truth values for training.

Further, the monitoring network can be set based on the actual situation. To improve the real-time performance of the system by directly running on MCUs above STM32F7, a simple convolutional neural network can be constructed according to the actual situation. For example, the monitoring network structure shown in FIG. 2 includes two convolution layers, two pooling layers and three fully connected layers. Alternatively, in order to improve the monitoring effect by computers or servers, the existing neural network model such as the Alexnet model can be slightly modified.

Further, in step 2, the method for determining the load switching event is as follows:

Step 2.1, setting two sliding windows, and removing the maximum and minimum values in each window.

Step 2.2, calculating the difference between the mean values of the two windows, and if the difference is greater than a set threshold, determining that the switching event has occurred.

Further, in step 4, the method for converting the V-I trajectory into the RGB image with a size of 2N*2N is as follows:

Step 4.1, firstly, defining an initial value of each pixel as (0, 0, 0).

Step 4.2, according to the obtained steady-state voltage and current of the load, obtaining the maximum absolute values Umax and Imax of the voltage and current.

Step 4.3, calculating $\Delta u = Umax/N$ and $\Delta i = Imax/N$.

Step 4.4, for each sampling point $(Uj, Ij)$ $(0 < j \leq sample$, sample is the number of sampling points in each cycle), calculating $$Xj = N + \text{int}\left(\frac{Uj}{\Delta u}\right),$$

$Yj = N + \text{int}(Ij/\Delta i)$ as the RGB pixel coordinates to be specifically defined without the continuous processing of the trajectory.

Step 4.5, defining the pixel value correspondingly according to the active power of the load.

Further, in step 4.2, the Umax and Imax of the high-power load are directly set to fixed values, which are greater than the Umax or Imax of the high-power load. In such a way that, the V-I trajectory can contain most of the current data.

Further, in order to fully reflect the steady-state features of the load in the RGB image, the V-I trajectory is divided into three stages, and the color information of the pixels in each stage is set differently. The V-I trajectory feature diagram obtained in this way can largely reflect the phase difference, impedance features and power, etc. of the voltage and current. Because the Umax of high-power and low power are defined differently when composing the RGB feature image, it is easy to identify high-power and low-power loads. The low-power load is monitored according to the shape and brightness (the brightness includes power information) of the RGB feature image, and the high-power load is monitored according to the shape of the RGB feature diagram (in case the power is different, the shape of the feature diagram is different because the current is different).

The beneficial effects of the present disclosure are as follows: in the present disclosure, by constructing the RGB image, the V-I trajectory features and power features can be fully utilized to perform load monitoring. By the method, the low-power load and high-power load can be fully monitored. For the low-power load, loads with similar power are distinguished according to the trajectory shape of the loads, and loads with similar shapes are distinguished according to the power values of the loads. High-power loads are mainly distinguished according to the trajectory shape of the loads. The overall monitoring effect is better.

DESCRIPTION OF EMBODIMENTS

Figure 1:
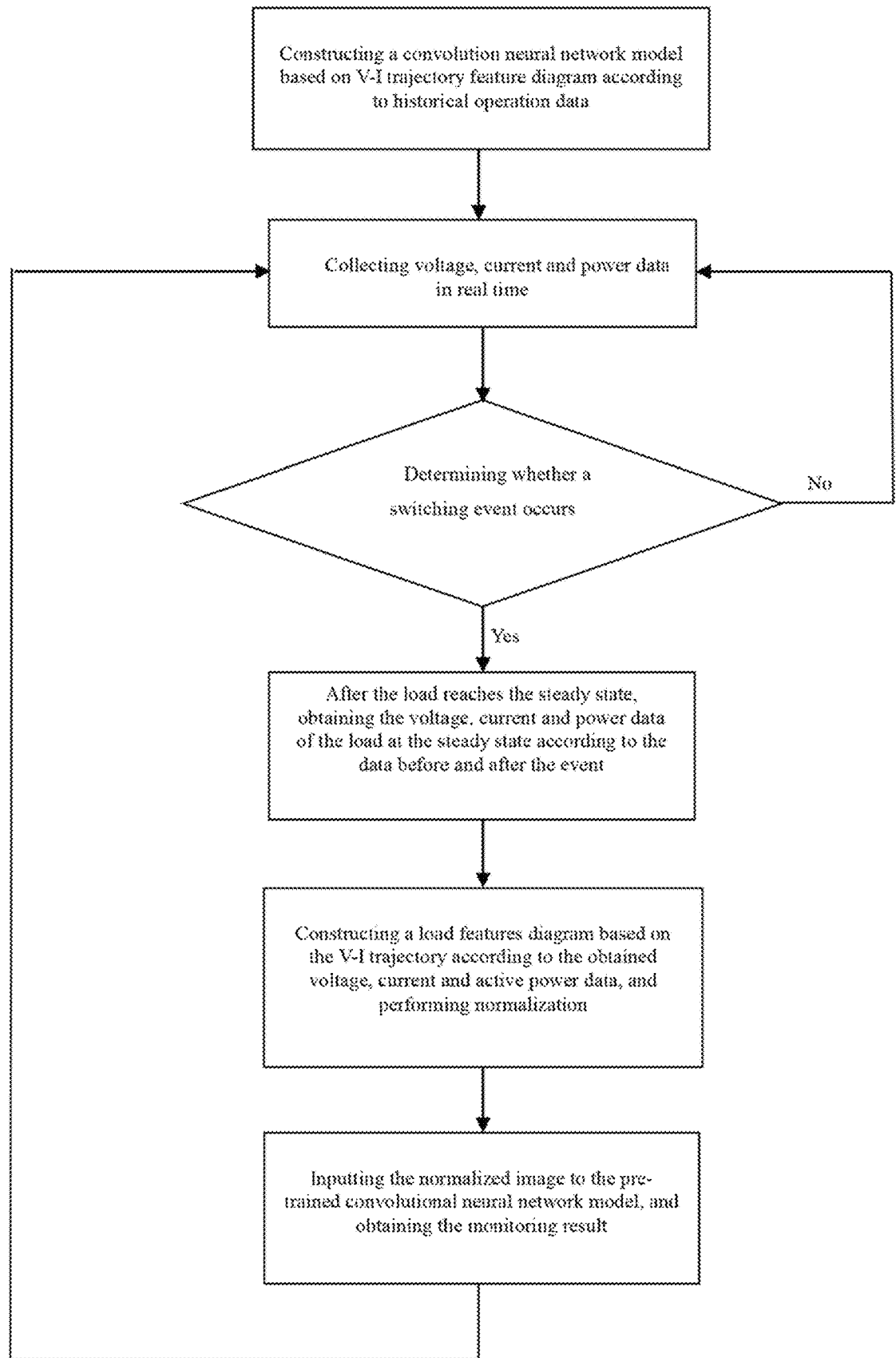
FIG. 1 is a flow chart of the method according to the present disclosure.
Figure 2:
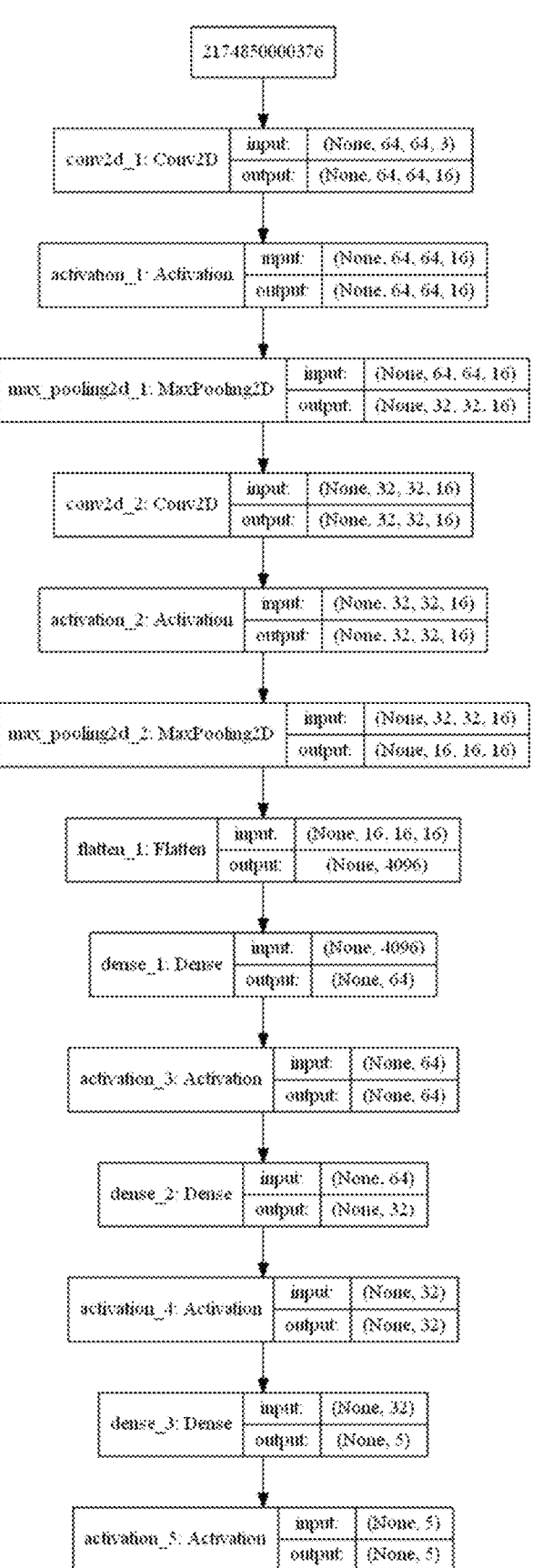
FIG. 2 is a schematic structural diagram of a convolutional neural network model according to an embodiment of the present disclosure.

The present disclosure is illustrated with reference to the drawings and the implementation using the BLUED public dataset, and the specific implementation step are as follows:

The present disclosure provides a non-intrusive load monitoring method based on V-I trajectory and neural network, as shown in FIG. 1, the implementation steps of the method include:

S1: firstly, extracting the data of 5 kinds of household electrical equipment from the BLUED dataset, and then constructing an RGB color diagram based on the V-I trajectory features, and training a convolutional neural network model as a monitoring network, such as the Alexnet model. The monitoring network model in the embodiment is shown in the figures. In order to run directly on MCUs above STM32F7, the constructed monitoring network model includes two convolution layers, two pooling layers and three fully connected layers, which is not complicated. The specific structure is shown in FIG. 2.

S2: collecting voltage, current and power data of an electric household side in real time, and performing filtering processing to the obtained voltage and current data. In the embodiment, the voltage and current sampling frequency of the BLUED public dataset is 12

KHz, the power value frequency is 60 Hz, and each cycle includes 200 sampling points.

Figure 3:
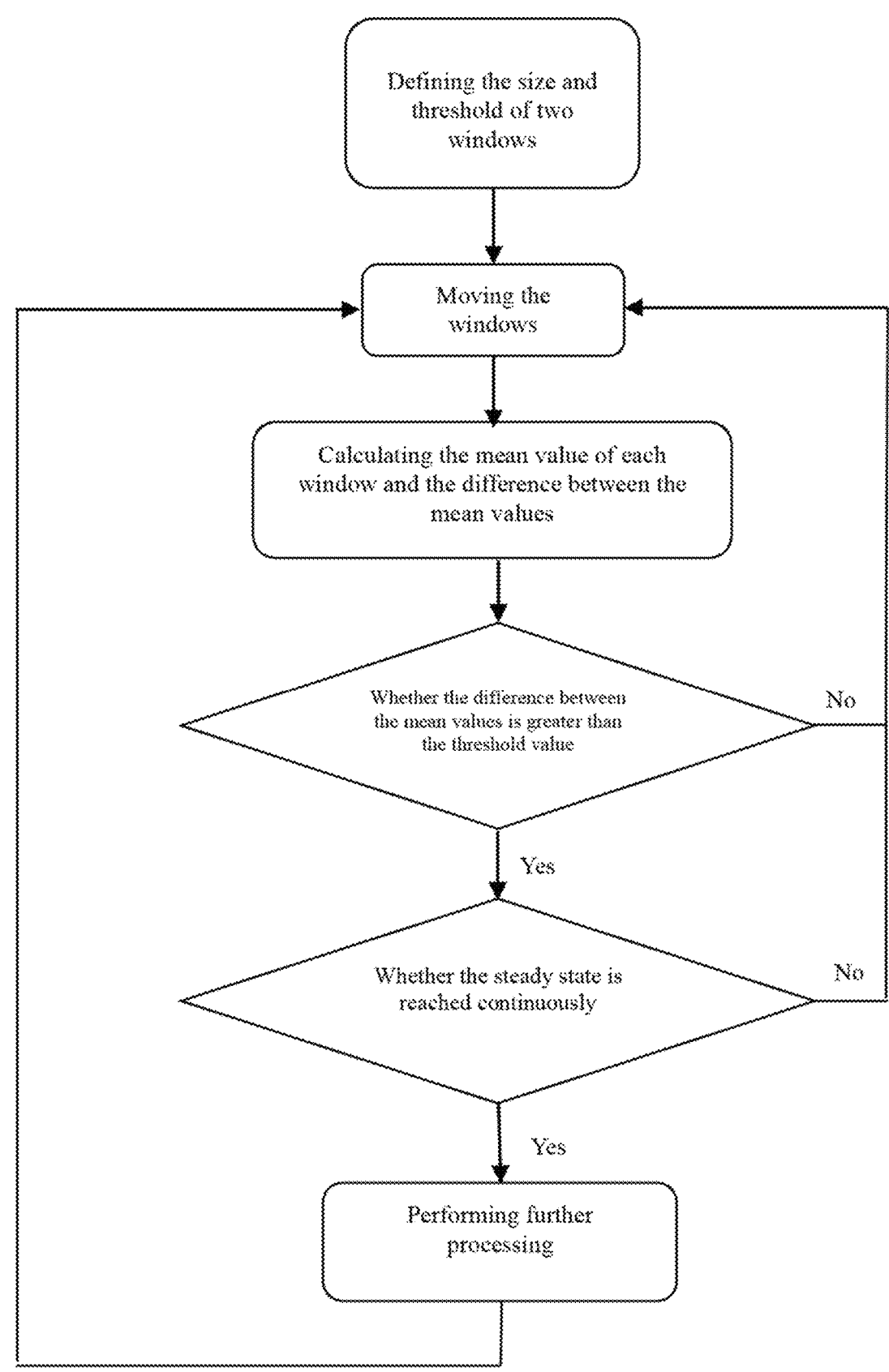
FIG. 3 is a flow chart of the bilateral sliding window algorithm.

S3: determining whether a switching event occurs through the bilateral sliding window algorithm. In the embodiment, the specific parameters are as follows: setting two sliding windows with a window size of (5, 5), and removing the maximum and minimum values in each windows, calculating the mean value of each window, calculating the difference between the mean values, then comparing the difference with a preset threshold, and determining that the switching event has occurred, if the difference between the mean values is greater than the preset threshold, of which the process is shown in FIG. 3.

S4: after the load reaches the steady state for three times consecutively, obtaining the voltage, current and power data of the load at the steady state.

S5: obtaining the V-I trajectory according to the steady-state voltage and current data obtained in S4, and then converting the V-I trajectory into an RGB image with a size of 2N*2N. In the embodiment, N is 32; the specific steps are as follows:

(1) Firstly, defining an initial value of each pixel as (0, 0, 0).

(2) Calculating the maximum absolute values Umax and Imax of the voltage and current of the low-power load, and directly defining the Imax of the high-power load as a fixed value, so that the V-I trajectory can contain all the current information. In the embodiment, the loads with the active power values of less than 510 W are regarded as low-power loads, and the others are regarded as high-power loads. For the high-power loads, defining the fixed value of Umax as 400V and the fixed value of Imax s 20 A. In this way, the V-I trajectory may contain most of the current data.

(3) Calculating $\Delta u = Umax/N$ and $\Delta i = Imax/N$.

(4) Calculating $$Xj = N + int\left(\frac{Uj}{\Delta u}\right),$$

Yj=N+int(Ij/$\Delta$i) for each sampling point (Uj, Ij) (0<j≤200) without the continuous processing of the trajectory.

(5) Defining the corresponding pixel value according to the active power of the load. When the active power P is greater than 510 W, the electrical equipment with a relatively large power value has obvious features, and thus can also be correctly monitored through general V-I trajectory features. Therefore, the value of each pixel point is directly set color_value=255. When the active power P is less than 510 W, defining color_value=int(P/2).

(6) In order to fully reflect the steady-state features of the load in the RGB image, the specific process of defining the pixel value (Xj, Yj) is as follows:

If 0<j<200/3:

The pixel value (Xj, Yj) is defined as (color_value, 0, 0).

If 200/3<j<2*200/3:

The pixel value (Xj, Yj) is defined as (0, color_value, 0).

else:

The pixel value (Xj, Yj) is defined as (0, 0, color_value).

Figures 4, 5:
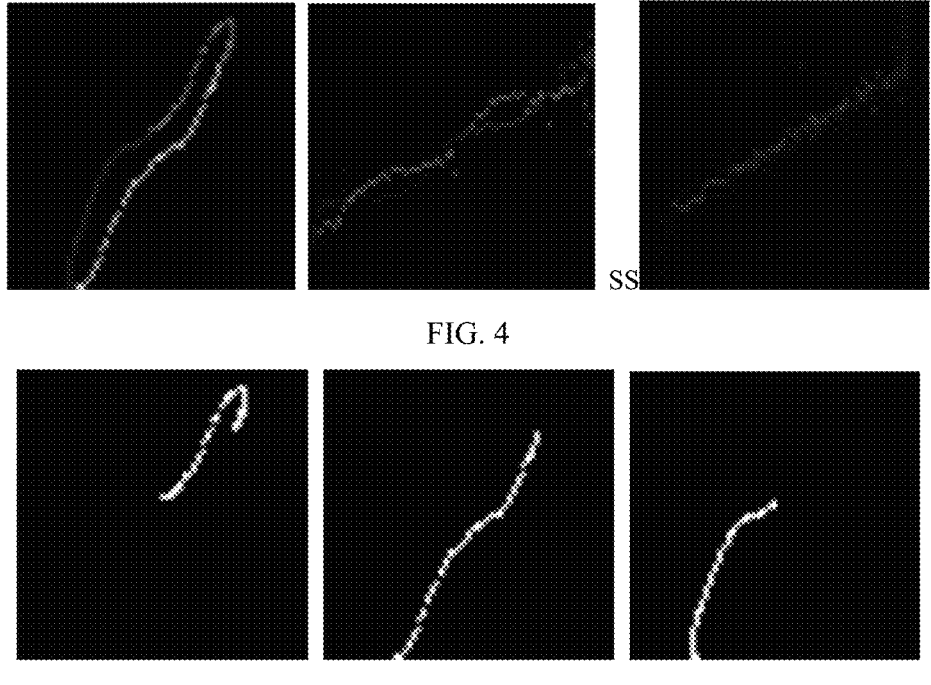
FIG. 4 is a feature diagram of some loads (left: air conditioner, middle: refrigerator, right: electric lamp) based on the V-I trajectory according to an embodiment of the present disclosure.
FIG. 5 is a gray diagram showing R, G and B channels, respectively, in the air conditioner feature diagram (left: R channel, middle: G channel, right: B channel).

The V-I trajectory feature diagram obtained in this way can reflect the load features such as the phase difference of the voltage and current, impedance features and power. FIG. 4 below is a trajectory features diagram of some loads in the embodiment. In FIG. 4, the high-power load and low-power load can be seen directly by the naked eye, in which the power of the electric lamp is smaller, so the corresponding brightness is smaller. Because the Umax of the high-power load is directly defined as 400V, the trajectory feature diagram is relatively concentrated in the middle, and the feature diagram of the low-power load covers the entire area. Then each load trajectory feature diagram is composed of three colors of red, green and blue (the three channels R, G and B of the trajectory in the air conditioner feature diagram in FIG. 5 are shown separately), and has directions. The brightness of the low-power load feature diagram is also various according to the power.

S6: normalizing the RGB image obtained in S5, inputting it into the pre-trained convolutional neural network, and obtaining the monitoring result. Because the input end of the neural network is a picture, the normalization processing in the embodiment is very simple, which just divides the value of each pixel point directly by 255. The RGB image in the present disclosure already contains information such as the V-I trajectory features, phase difference between the voltage and current, active power, etc., so the monitoring effect is much better than the method by using the V-I trajectory or power information alone. Moreover, the convolutional neural network used is not complicated, and thus can be directly run on embedded devices, and further improve the real-time performance, and does not rely on the computing support of the servers.

In this application, the term "controller" and/or "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components (e.g., op amp circuit integrator as part of the heat flux data module) that provide the described functionality; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

The steps of the method or algorithm described combined with the embodiments of the present disclosure may be implemented in a hardware manner, or may be implemented in a manner in which a processor executes software instructions. The software instructions may consist of corresponding software modules, and the software modules can be stored in Random Access Memory (RAM), flash memory, Read Only Memory (ROM), Erasable Programmable ROM (EPROM), Electrically Erasable Programmable Read-Only Memory (EEPROM), registers, hard disks, removable hard disks, CD-ROMs or any other forms of storage media well-known in the art. An exemplary storage medium is coupled to the processor, such that the processor can read information from, and write information to, the storage medium. The storage medium can also be an integral part of the processor. The processor and storage medium may reside in an Application Specific Integrated Circuit (ASIC). Alternatively, the ASIC may be located in a node device, such as the processing node described above. In addition, the processor and storage medium may also exist in the node device as discrete components.

It should be noted that when the data compression apparatus provided in the foregoing embodiment performs data compression, division into the foregoing functional modules is used only as an example for description. In an actual application, the foregoing functions can be allocated to and implemented by different functional modules based on a requirement, that is, an inner structure of the apparatus is divided into different functional modules, to implement all or some of the functions described above. For details about a specific implementation process, refer to the method embodiment. Details are not described herein again.

All or some of the foregoing embodiments may be implemented by using software, hardware, firmware, or any combination thereof. When the software is used for implementation, all or some of the embodiments may be implemented in a form of a computer program product. The computer program product includes one or more computer instructions. When the computer program instructions are loaded and executed on a server or a terminal, all or some of the procedures or functions according to the embodiments of this application are generated. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial optical cable, an optical fiber, or a digital subscriber line) or wireless (for example, infrared, radio, or microwave) manner. The computer-readable storage medium may be any usable medium accessible by a server or a terminal, or a data storage device, such as a server or a data center, integrating one or more usable media. The usable medium may be a magnetic medium (for example, a floppy disk, a hard disk, or a magnetic tape), an optical medium (for example, a digital video disk (DVD)), or a semiconductor medium (for example, a solid-state drive).

Obviously, the above mentioned embodiments are only examples for clear description, rather than limiting the implementation. For those skilled in the art, on the basis of the above description, other different forms of changes or variations can also be made. It is unnecessary and impossible to exhaust all implementations here. However, the obvious changes or variations derived therefrom are still within the protection scope of the present disclosure.

What is claimed is:

1. A non-intrusive load monitoring method based on a V-I trajectory and a neural network, comprising:

step 1, collecting voltage, current and power data of a load of an electric household side in real time through a household electricity meter installed in a home or a building, and performing filtering on the collected voltage, current and power data;

step 2, applying a bilateral sliding window algorithm to the filtered power data, comprising: in two adjacent windows with a same number of sampling data points of the filtered power data, removing a maximum value and a minimum value of data in each window, respectively, calculating an average value of the data in each window, comparing a difference between average values of the data in the two adjacent windows with a preset threshold, and determining that the switching event occurs in response to determining that the difference exceeds the preset threshold;

step 3, continuously detecting the power data of the load, after the power data maintains a same steady state for at least 3 consecutive times, obtaining voltage, current, and power data of the load according to data in a steady state before and after the switching event;

step 4, obtaining a V-I trajectory through the voltage and current data in the steady state obtained in step 3, and converting the V-I trajectory into an RGB image with a size of 2N*2N, where N is a positive integer, wherein the RGB image is used to reflect shape characteristics of the V-I trajectory, a phase difference of the voltage and current data, and a characteristic information of an active power, power characteristics are represented by an image pixel value, and wherein said converting the V-I trajectory into the RGB image with the size of 2N*2N comprises:

step 4.1, defining an initial value of each pixel to (0, 0, 0);

step 4.2, obtaining, according to the voltage and current data at the steady state of the load obtained in step 3, a maximum absolute value Umax of the voltage data and a maximum absolute value Imax of the current data, for high-power loads with an active power greater than or equal to 510 W, setting Umax to 400V and Imax to 20 A; and for low-power loads with the active power less than 510 W, dynamically calculating Umax and Imax;

step 4.3, calculating $\Delta u=Umax/N$ and $\Delta i=Imax/N$:

step 4.4, calculating $$Xj = N + \text{int}\left(\frac{Uj}{\Delta u}\right),$$

Yj=N+int (Ij/$\Delta$i), as RGB pixel coordinates to be defined, for each sampling point (Uj, Ij), where 0<js sample, and 'sample' refers to a number of sampling points collected within one complete cycle of a voltage or current waveform, based on a nominal line frequency; and step 4.5, defining a pixel value correspondingly according to an active power value of the load; dividing the V-I trajectory into three stages, and then setting pixels in each stage to three different colors, comprising:

If 0<j<sample/3, then a pixel value (Xj, Yj) is defined as (color_value, 0, 0);

If sample/3<j<2*sample/3, then the pixel value (Xj, Yj) is defined as (0, color_value, 0);

If j>2*sample/3, then the pixel value (Xj, Yj) is defined as (0, 0, color_value);

wherein color_value represents the defined pixel value; and step 5, normalizing the RGB image obtained in step 4, and inputting the normalized RGB image into a monitoring network implemented using a convolutional neural network (CNN) or an AlexNet model, determining, by the monitoring network, a load monitoring result, and transmitting the load monitoring result via an STM32F7 microcontroller to a user terminal for notifying a user of a current operational status of the load in the home or building, wherein the convolutional neural network comprises two convolutional layers, two max pooling layers and three fully connected layers, and is trained using historical operation data of an electrical device and the RGB image constructed based on V-I trajectory features; and wherein the convolutional neural network is configured to run directly on a microcontroller unit (MCU) having computational resources greater than an STM32F7 microcontroller, and wherein the AlexNet model enables the non-intrusive load monitoring method to be executed on a computer or server.

* * * * *